(12) United States Patent
Lien

(10) Patent No.: US 8,835,754 B2
(45) Date of Patent: Sep. 16, 2014

(54) METHOD OF MANUFACTURING SEE-THROUGH THIN FILM SOLAR CELLS

(71) Applicant: Shui-Yang Lien, Yunlin County (TW)

(72) Inventor: Shui-Yang Lien, Yunlin County (TW)

( * ) Notice: Subject to any disclaimer, the term of this patent is extended or adjusted under 35 U.S.C. 154(b) by 0 days.

(21) Appl. No.: 14/226,443

(22) Filed: Mar. 26, 2014

(65) Prior Publication Data

US 2014/0206129 A1 Jul. 24, 2014

Related U.S. Application Data

(63) Continuation-in-part of application No. 13/185,893, filed on Jul. 19, 2011.

(51) Int. Cl.

| | | |
|---|---|---|
| *H01L 31/0236* | (2006.01) | |
| *H01L 31/0352* | (2006.01) | |
| *H01L 31/042* | (2014.01) | |
| *H01L 31/048* | (2014.01) | |
| *H01L 31/18* | (2006.01) | |
| *H01L 21/027* | (2006.01) | |
| *H01L 21/77* | (2006.01) | |
| *H01L 21/461* | (2006.01) | |

(52) U.S. Cl.
CPC ..................................... *H01L 31/18* (2013.01)
USPC ........... 136/256; 136/243; 136/244; 136/249; 438/71; 438/98

(58) Field of Classification Search
USPC ............ 136/243, 244, 249, 246, 256; 438/71, 438/98
See application file for complete search history.

(56) References Cited

U.S. PATENT DOCUMENTS

| | | | | |
|---|---|---|---|---|
| 4,795,500 | A | * | 1/1989 | Kishi et al. .................... 136/244 |
| 7,259,321 | B2 | | 8/2007 | Oswald et al. |
| 2006/0112987 | A1 | * | 6/2006 | Nakata et al. ................. 136/256 |

* cited by examiner

*Primary Examiner* — Jayne Mershon
*Assistant Examiner* — Mayla Gonzalez Ramos
(74) *Attorney, Agent, or Firm* — Muncy, Geissler, Olds & Lowe, P.C.

(57) ABSTRACT

A method of manufacturing see-through thin film solar cells includes the steps of: placing a patterned photo mask above a first substrate which has a photoelectric conversion film formed on the surface thereof; and ablating the photoelectric conversion film via a laser beam passing through the patterned photo mask to form at least one hollow-out zone with different transmittance. By incorporating the laser beam with the photo mask in the manufacturing process, the problem of shortened laser lifespan caused by frequent switching of the laser for ablating patterns that occurs to the conventional technique can be resolved. Through controlling the thickness of the patterned photo mask, grey scale patterns can be displayed and resolution thereof can also be increased, thereby improve the added value of the thin film solar cells.

10 Claims, 9 Drawing Sheets

METHOD OF MANUFACTURING SEE-THROUGH THIN FILM SOLAR CELLS

This application is a continuation-in-part, and claims priority, of from U.S. patent application Ser. No. 13/185,893 filed on Jul. 19, 2011, entitled "SEE-THROUGH THIN FILM SOLAR CELLS AND METHOD OF MANUFACTURING THE SAME", the entire contents of which are hereby incorporated by reference.

FIELD OF THE INVENTION

The present invention relates to a method of manufacturing thin film solar cells and particularly to a method of manufacturing see-through thin film solar cells.

BACKGROUND OF THE INVENTION

In recent years, in order to solve the problem of increasing shortage of energy resources and reduce pollution caused by production of energy, green energy technologies have been developed aggressively. Solar cells can be installed with less location restrictions and energy source can be acquired easily, thus have been developed by a lot of enthusiasts. Thin film solar cells have the characteristics of low cost and mass production, hence grow rapidly in the market. Moreover, thin film solar cells can be formed on a wide variety of substrates, such as glass, plastics, ceramics, graphite, metal sheets and the like, with less restriction in use, and also can be formed on pliable substrates to further improve use flexibility. In addition, a thin film capable of generating electric voltage requires only a thickness of a few micrometers, thus consumes less material compared with silicon wafers which have to be maintained at a certain thickness. In order to be installed outdoors at a larger size to capture more solar energy and equip with required strength and transparency, the conventional thin film solar cells are commonly use glass as substrate, thereby to save more electric power expense and reduce carbon footprint.

U.S. Pat. No. 7,259,321 entitled "METHOD OF MANUFACTURING THIN FILM PHOTOVOLTAIC MODULES" discloses a method of manufacturing thin film solar cell. Its module uses an opaque metal layer that has undesirable transparency. As the opaque solar cell module blocks user's vision, its applications are limited to rain sheds, awnings, house roof or the like, and cannot be extended to the windows of the buildings. To improve indoor lighting and increase added value of the thin film solar cells adoptable to the windows, the thin film solar cells are generally formed with a patterned light permeable zone by laser beams. The light permeable zone can increase the aesthetic appeal and artistic value of the windows. Moreover, the light permeable zone provides greater transparency and improves indoor lighting.

However, the conventional light permeable zone is formed by ablating the thin film solar cells with a laser beam controlled by a computer in a switching manner. Resolution is less desirable. Moreover, frequent switching of the laser beam easily damages laser equipment and results in a shorter lifespan. In addition, laser operated in the switching manner can only display black and white patterns and is unable to display grey scale patterns. To form colored patterns on the thin film solar cells also is not possible. As a result, it is difficult to increase their added value and usability. In short, to improve the resolution of patterns and display grey scale or colored patterns become one of goals actively pursued in the industry of thin film solar cells.

SUMMARY OF THE INVENTION

The primary object of the present invention is to solve the problems of low resolution and unavailability of displaying grey scale of see-through thin film solar cells.

Another object of the present invention is to solve the problem of reduced lifespan of laser equipments caused by frequent switching during fabrication of see-through thin film solar cells.

Yet another object of the present invention is to solve the problem of unable to display colored patterns of the thin film solar cells.

To achieve the foregoing objects the present invention provides a method of manufacturing see-through thin film solar cells that comprises the following steps:

S1: Forming a photoelectric conversion film on the surface of a first substrate;

S2: Placing a patterned photo mask above the photoelectric conversion film; the photo mask including a high mask section and a low mask section that are formed at different thicknesses;

S3: Ablating the photoelectric conversion film via a laser beam passing through the patterned photo mask to form at least one hollow-out zone on the photoelectric conversion film; the hollow-out zone including a high transparent section corresponding to the low mask section and a low transparent section corresponding to the high mask section;

S4: Preparing a second substrate and a packaging adhesive film disposed between the first substrate and the second substrate; and S5: Bonding the first and second substrates through the packaging adhesive film, wherein the first substrate is bonded to the second substrate with the surface thereof including the photoelectric conversion film through the packaging adhesive film to form a solar cell.

In order to display colored patterns, a step S6 is inserted between the steps S4 and S5 of coloring the positions corresponding to the hollow-out zone with a colored pigment to form a colored pattern layer between the first and second substrates to display colored patterns.

By means of the aforesaid techniques, laser ablation to the photoelectric conversion film can be controlled via thickness control of the patterned photo mask to allow the hollow-out zone to display grey scale images as desired. The problem of reduced lifespan of laser equipments caused by frequent switching of the laser to fabricate the hollow-out zone occurred to the conventional techniques can also be averted. Through the colored pattern layer, the thin film solar cell of the invention can also display colored patterns, thus provides more added value.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
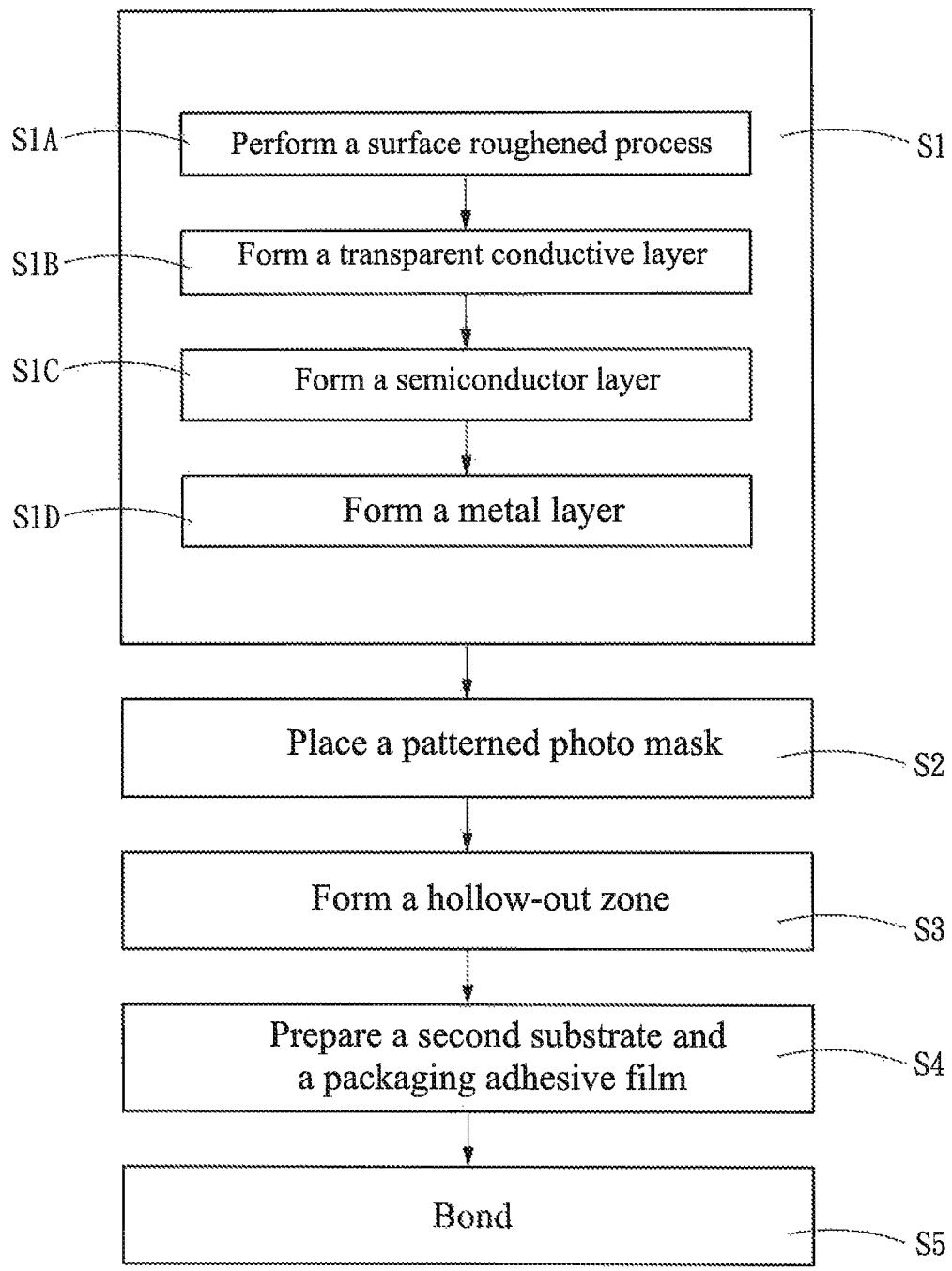
FIG. 1 is a flowchart of an embodiment of the present invention.
Figure 2:
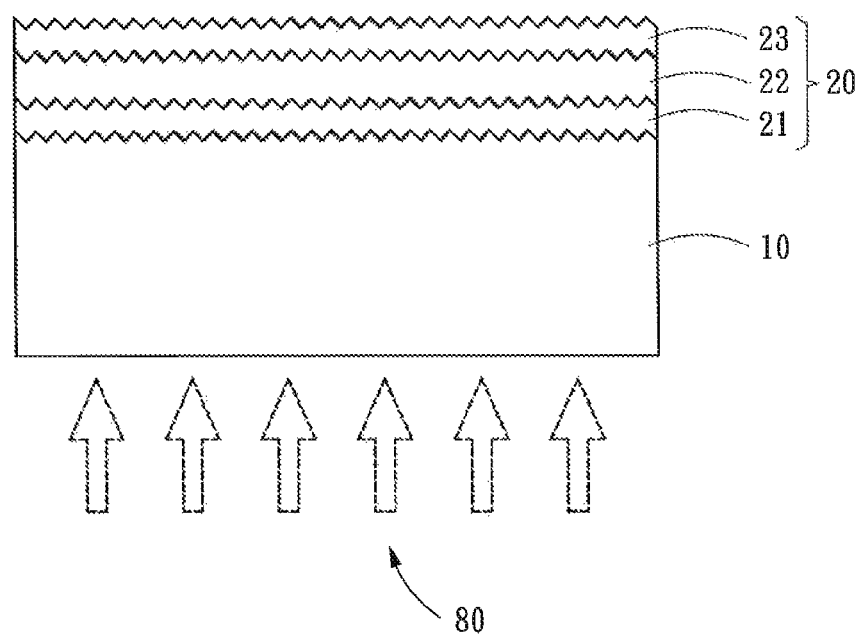
FIG. 2 is a schematic manufacturing structure of an embodiment of the present invention.
Figure 3A:
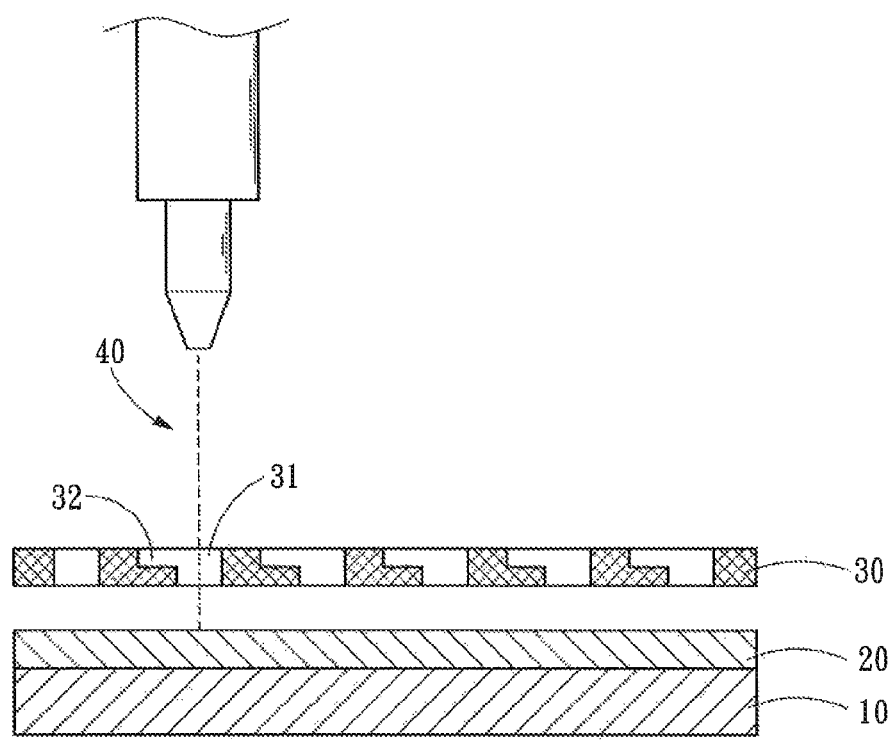
FIG. 3A is a schematic view of an embodiment of laser ablation of the present invention.
Figure 3B:
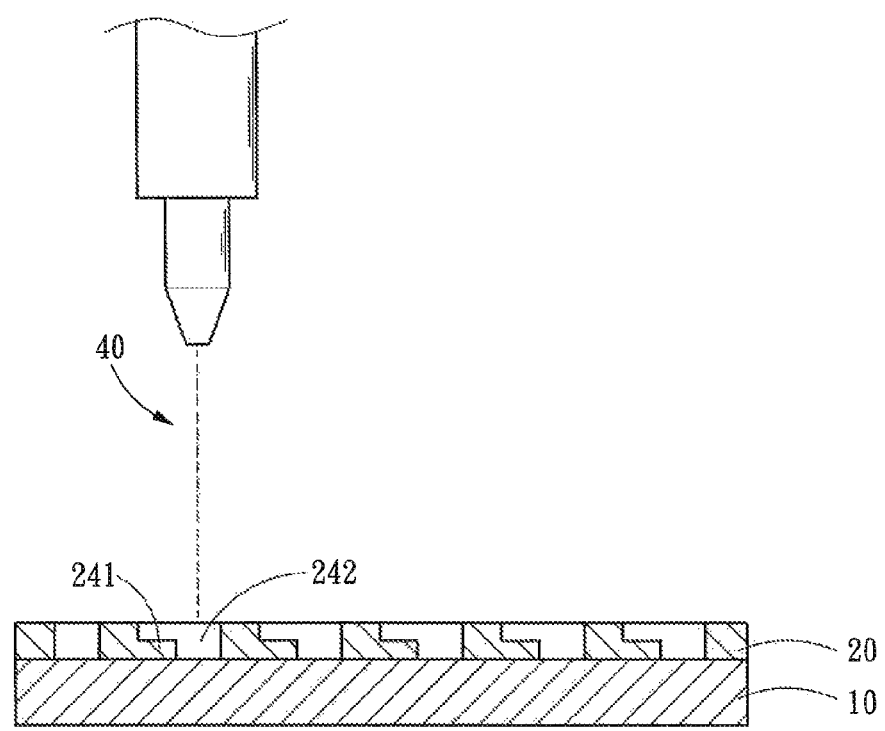
FIG. 3B is another schematic view of an embodiment of laser ablation of the present invention.

The present invention provides a method of manufacturing see-through thin film solar cells that comprises the following steps, please referring to FIGS. 1 and 2:

S1: Forming a photoelectric conversion film 20 on the surface of a first substrate 10. The photoelectric conversion film 20 is fabricated according to the steps as follows:

S1A: Roughening the surface of the first substrate 10 to form a coarse surface to reduce total reflection of light 80 and increase light extraction efficiency of the first substrate 10;

S1B: Forming a transparent conductive layer 21 made of indium tin oxide (ITO) or zinc gallium oxide on the coarse surface of the first substrate;

S1C: Forming a semiconductor layer 22 on one side of the transparent conductive layer 21 remote from the first substrate 10, wherein the semiconductor layer 22 may be a PIN semiconductor to absorb light and convert the light to electric energy; and S1D: Forming a metal layer 23 on one side of the semiconductor layer 22 remote from the transparent conductive layer 21, wherein the metal layer 23 is made of silver or aluminum to incorporate with the transparent conductive layer 21 to receive and transfer the electric energy converted by the semiconductor layer 22;

S2: Placing a patterned photo mask 30 above the photoelectric conversion film 20, referring to FIG. 3A; the photo mask 30 including a high mask section 32 and a low mask section 31 that are formed at different thicknesses;

S3: Forming at least one hollow-out zone 24 on the photoelectric conversion film 20, referring to FIGS. 3B and 4, by a laser beam 40 passing through the patterned photo mask 30 to ablate the photoelectric conversion film 20; the hollow-out zone 24 including a high transparent section 242 corresponding to the low mask section 31 and a low transparent section 241 corresponding to the high mask section 32. Namely, through the blocking of the patterned photo mask 30, the laser beam 40 only has to scan all over the patterned photo mask 30. By controlling the thickness of the patterned photo mask 30, the intensity of the laser beam 40 passing through the patterned photo mask 30 can be controlled to display grey scale patterns. As a result, grey scale patterns can be displayed through the high transparent section 242 and low transparent section 241 of the hollow-out zone 24. Collaborated with different shapes of the patterns, different dimensions of ablated areas are formed. Experiments show that with about 10% area of the photoelectric conversion film 20 ablated by the laser beam 40, significant transparency and illumination effect can be achieved. Energy conversion efficiency decreases only about 10% compared with the one prior to ablating. Photoelectric conversion efficiency does not have very much impact, but total indoor illumination increases significantly compared with conditions prior to ablating;

S4: Preparing a second substrate 50 and a packaging adhesive film 60 which is disposed between the first substrate 10 and the second substrate 50. The packaging adhesive film 60 is an elastic adhesive or thermoplastic. The elastic adhesive is selected from ethylene-vinyl acetate, polyurethane adhesive, polyacrylate adhesive, silicone or the like. The thermoplastic is selected from thermoplastic polyurethane (TPU), polyvinyl chloride, modified polyolefine or the like.

S5: Bonding the first and second substrates 10 and 50 through the packaging adhesive film 60, wherein the first substrate 10 is bonded to the second substrate 50 with the surface thereof including the photoelectric conversion film 60 through the packaging adhesive film 60 to form a solar cell.

Figure 4:
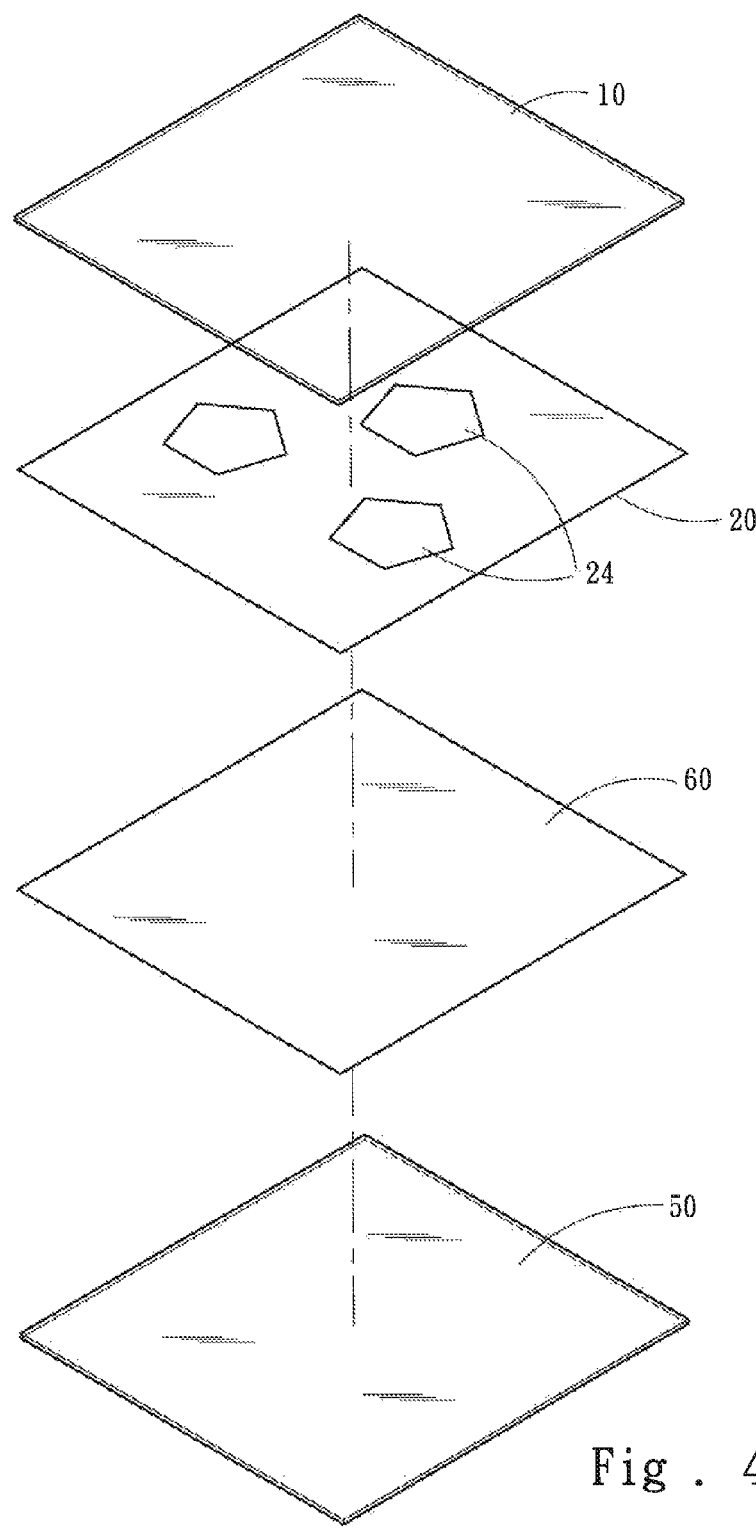
FIG. 4 is an exploded view of the structure of an embodiment of the present invention.

Please refer to FIGS. 2 and 4 for a thin film solar cell made by the method of the invention. It includes a first substrate 10, a photoelectric conversion film 20 formed on the surface of the first substrate 10, a second substrate 50 and a packaging adhesive film 60 located between the second substrate 50 and photoelectric conversion film 20. The photoelectric conversion film 20 includes a transparent conductive layer 21 bonded to the first substrate 10, a metal layer 23 and a semiconductor layer 22 located between the transparent conductive layer 21 and the metal layer 23. The packaging adhesive film 60 is made of an elastic adhesive or thermoplastic. The elastic adhesive is selected from ethylene-vinyl acetate, polyurethane adhesive, polyacrylate adhesive, silicone or the like. The thermoplastic is selected from thermoplastic polyurethane (TPU), polyvinyl chloride, modified polyolefine or the like. Also referring to FIGS. 3A and 3B, a laser beam 40 incorporating with a patterned photo mask 30 can ablate the surface of the photoelectric conversion film 20 to form at least one hollow-out zone 24; the photo mask 30 including a high mask section 32 and a low mask section 31 that are formed at different thicknesses, and the hollow-out zone 24 including a high transparent section 242 corresponding to the low mask section 31 and a low transparent section 241 corresponding to the high mask section 32. The first and second substrates 10 and 50 are bonded together via the packaging adhesive film 60. Upon light projection, light 80 can pass through the hollow-out zone 24 to display the patterns of the thin film solar cell.

Figure 5:
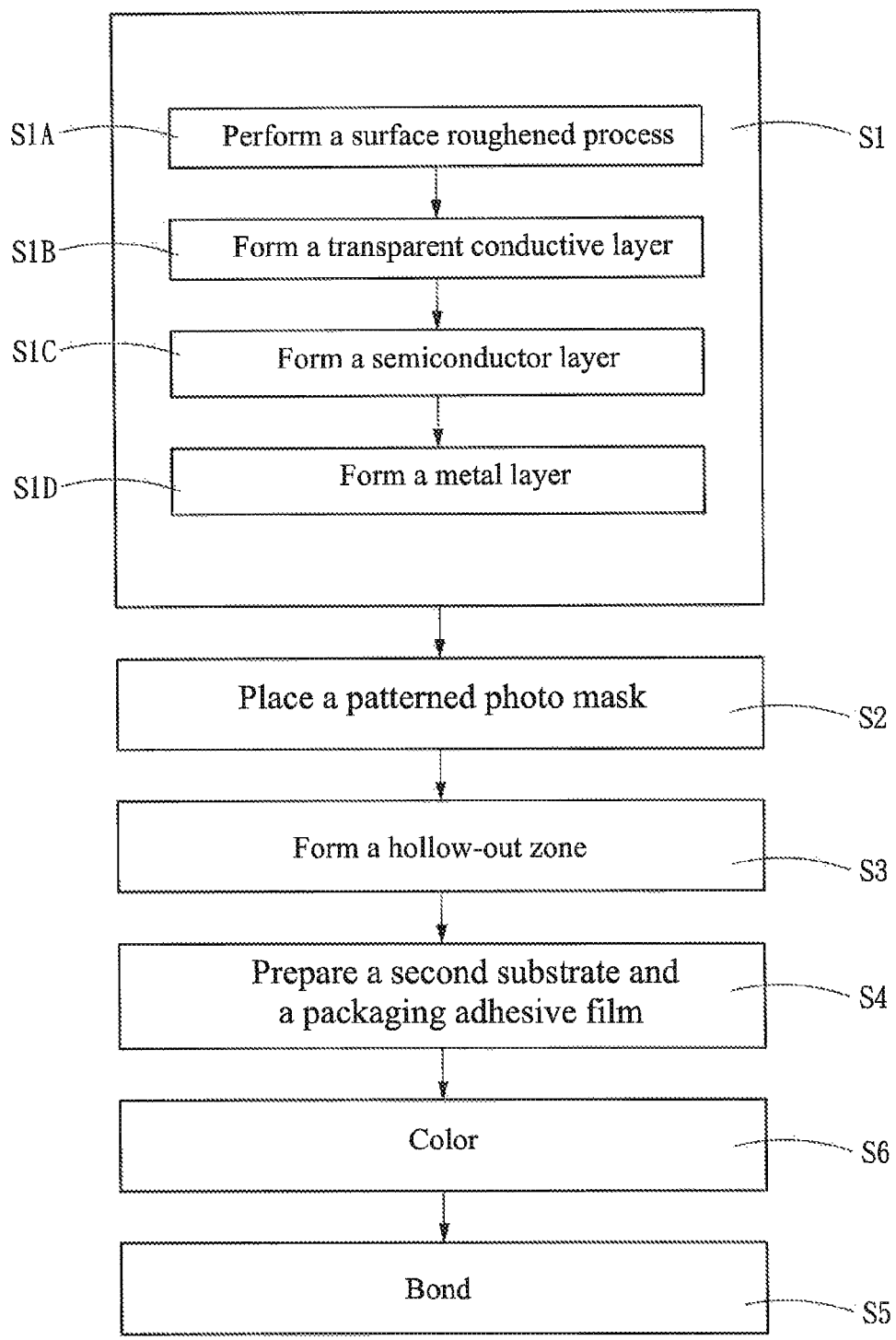
FIG. 5 is a flowchart of another embodiment of the present invention.
Figure 6:
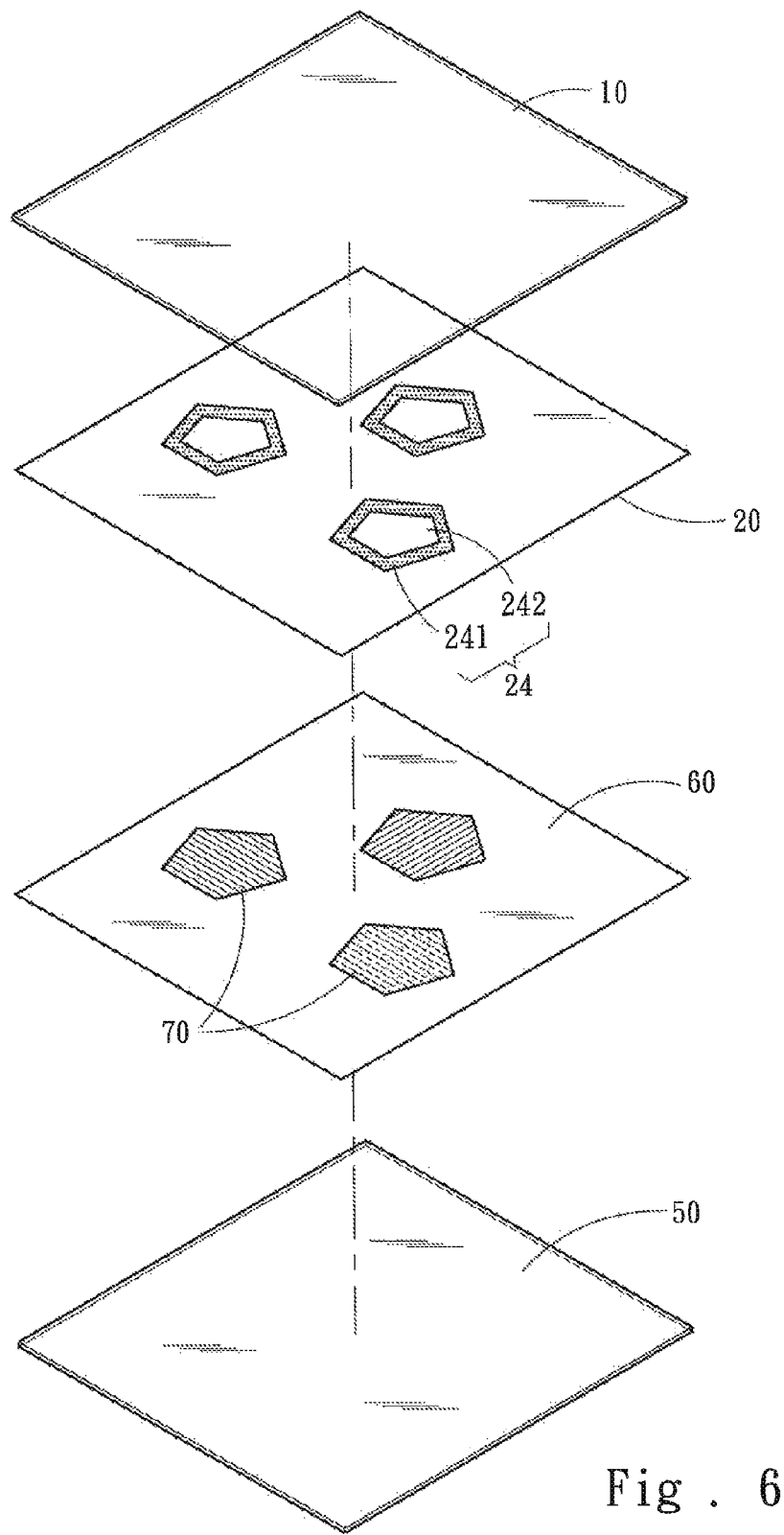
FIG. 6 is an exploded view of the structure of a second embodiment of the present invention.
Figure 7:
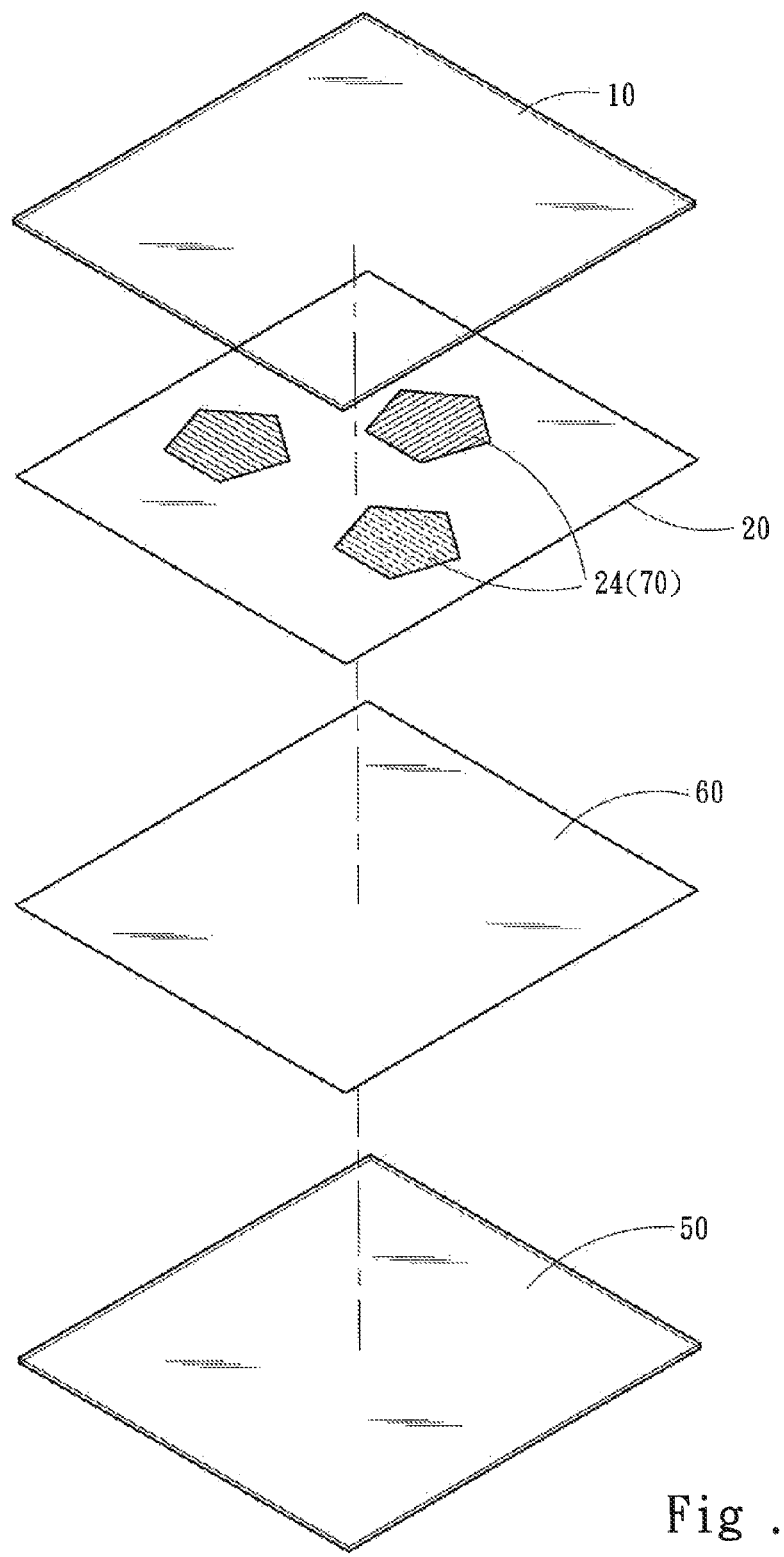
FIG. 7 is an exploded view of the structure of a third embodiment of the present invention.
Figure 8:
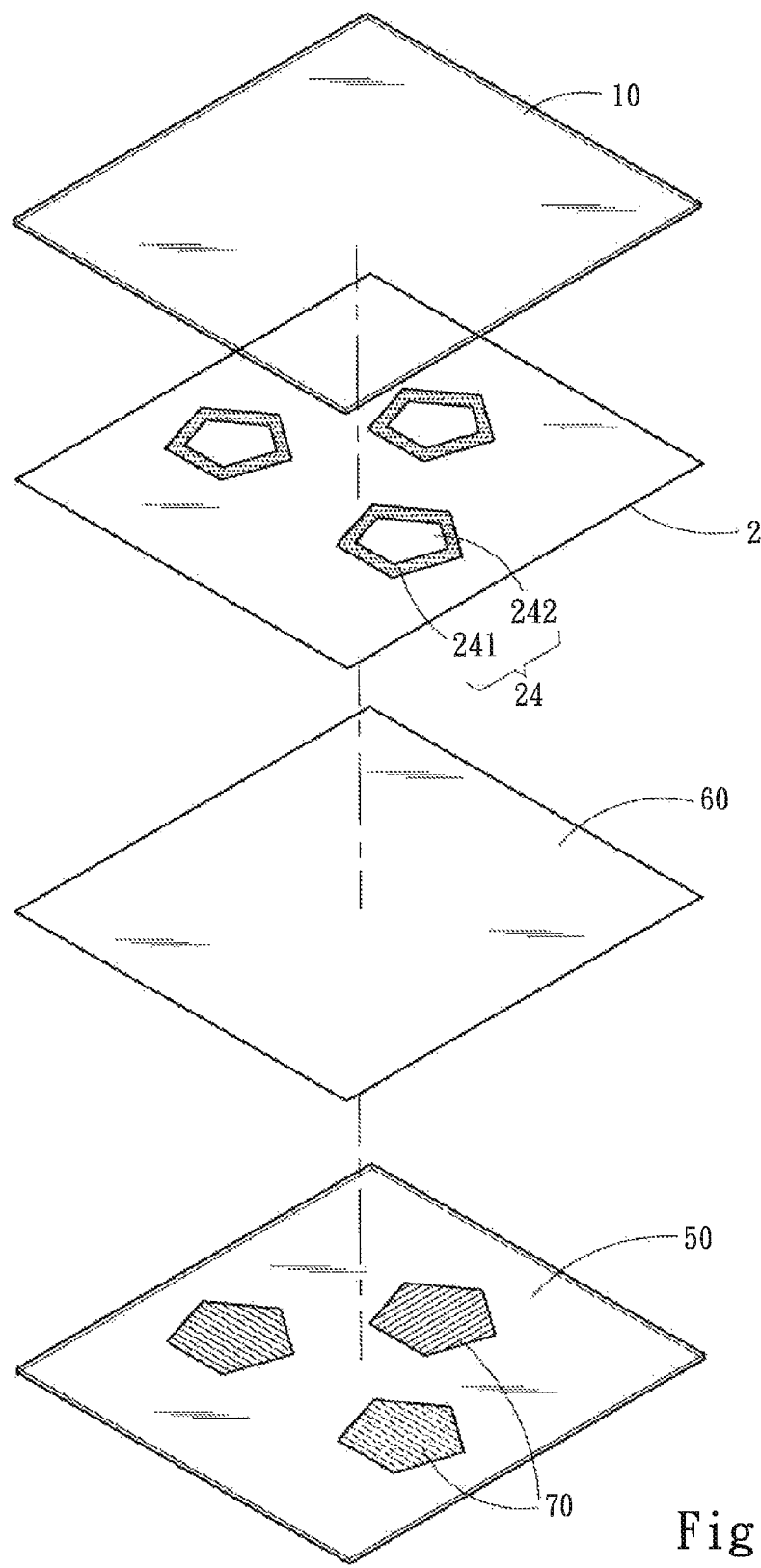
FIG. 8 is an exploded view of the structure of a fourth embodiment of the present invention.

Referring to FIGS. 5 and 6, in order to display colored patterns, a step S6 of coloring is inserted between steps S4 and S5. At step S6, the positions corresponding to the hollow-out zones 24 are colored via a colored pigment to form a colored pattern layer 70 between the first and second substrates 10 and 50. It is to be noted that, aside from coloring the packaging adhesive film 60 with the colored pigment to form the colored pattern layer 70 as shown in FIG. 6, the colored pattern layer 70 may also be formed as shown in FIG. 7 via another approach by coloring the photoelectric conversion film 20 with the colored pigment. Yet another approach is shown in FIG. 8 in which one side of the second substrate 50 adjacent to the packaging adhesive film 60 is colored with the colored pigment to form the colored pattern layer 70. The colored pigment can be coated via printing, ink jet printing, laser printing or manual coloring.

As previously discussed, the colored pattern layer 70 is located between the first and second substrates 10 and 50. More specifically, in the embodiment shown in FIG. 6, the colored pattern layer 70 is formed on the surface of the packaging adhesive film 60 via printing, ink jet printing, laser printing or manual coloring. In FIGS. 7 and 8, the colored pattern layer 70 is formed respectively on the photoelectric conversion film 20 where the hollow-out zone 24 is located and the surface of the second substrate 50 adjacent to the packaging adhesive film 60.

Compared with the conventional techniques, the invention provides many advantages, notably:

1. Ablating the photoelectric conversion film via the laser beam incorporating with the patterned photo mask, the problems of damages and reduced lifespan of laser caused by frequent switching can be averted.

2. With the patterned photo mask formed with a high mask section and a low mask section to incorporate with the laser beam ablation, grey scale pattern display can be achieved via the corresponding high and low transparent sections of the hollow-out zone and resolution also can be increased, 3. Through the colored pattern layer incorporating with the hollow-out zone, color display of the thin film solar cell is possible, thus more added value and enhanced aesthetic appeal can be realized when the thin film solar cell is adopted on windows.

4. The colored patterns can be formed by printing or ink jet printing to realize colored pattern display. Fabrication process is simpler and production cost can be reduced, and mass production also can be adopted easily.

What is claimed is:

1. A method of manufacturing a see-through thin film solar cell, comprising the steps of:
   S1: Forming a photoelectric conversion film on a surface of a first substrate;
   S2: Placing a patterned photo mask above the photoelectric conversion film, the photo mask including a high mask section and a low mask section that are formed at different thicknesses;
   S3: Ablating the photoelectric conversion film via a laser beam scanning and passing through the patterned photo mask to form at least one hollow-out zone on the photoelectric conversion film, the hollow-out zone including a high transparent section corresponding to the low mask section and a low transparent section corresponding to the high mask section wherein the thickness controls the intensity of the laser beam passing through the patterned photo mask;
   S4: Preparing a second substrate and a packaging adhesive film disposed between the first substrate and the second substrate; and
   S5: Bonding the first substrate and the second substrate through the packaging adhesive film, wherein the first substrate is bonded to the second substrate with the surface thereof including the photoelectric conversion film through the packaging adhesive film to form a solar cell.

2. The method of claim 1 further including a step S6 inserted between the steps S4 and S5 of coloring positions corresponding to the hollow-out zones with a colored pigment to form a colored pattern layer between the first and second substrates.

3. The method of claim 2, wherein the colored pigment is coated onto the photoelectric conversion film to form the colored pattern layer at the step S6.

4. The method of claim 2, wherein the colored pigment is coated onto the adhesive packaging adhesive film to form the colored pattern layer at the step S6.

5. The method of claim 2, wherein the colored pigment is coated onto the second substrate to form the colored pattern layer at the step S6.

6. The method of claim 2, wherein the colored pigment is selectively coated by printing, ink jet printing, laser printing or manual coloring to form the colored pattern layer.

7. The method of claim 1, wherein the packaging adhesive film prepared at the step S4 is elastic adhesive or thermoplastic.

8. The method of claim 1, wherein the packaging adhesive film is selected from the group consisting of ethylene-vinyl acetate, polyurethane adhesive, polyacrylate adhesive, silicone and combinations thereof.

9. The method of claim 1, wherein the packaging adhesive film is selected from the group consisting of thermoplastic polyurethane, polyvinyl chloride, modified polyolefine and combinations thereof.

10. The method of claim 1, wherein the step S1 further includes steps of:
    S1A: roughening the surface of the first substrate to form a coarse surface;
    S1B: forming a transparent conductive layer on the coarse surface;
    S1C: forming a semiconductor layer on one side of the transparent conductive layer remote from the first substrate to absorb light and convert the light to electric energy; and
    S1D: forming a metal layer on one side of the semiconductor layer remote from the transparent conductive layer, the metal layer and the transparent conductive layer receiving and conducting the electric energy converted by the semiconductor layer.

* * * * *